United States Patent
Gottlieb et al.

(10) Patent No.: US 7,411,315 B2
(45) Date of Patent: Aug. 12, 2008

(54) BATTERY COMMUNICATION SYSTEM

(75) Inventors: Peter A. Gottlieb, Belmont, MA (US); Rodger B. Dowdell, Jr., Saunderstown, RI (US)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 11/706,921

(22) Filed: Feb. 13, 2007

(65) Prior Publication Data

US 2007/0200434 A1 Aug. 30, 2007

Related U.S. Application Data

(63) Continuation of application No. 11/090,731, filed on Mar. 25, 2005, now Pat. No. 7,199,489, which is a continuation of application No. 10/784,329, filed on Feb. 23, 2004, now abandoned, which is a continuation of application No. 09/864,037, filed on May 23, 2001, now Pat. No. 6,803,678, which is a continuation of application No. 08/205,527, filed on Mar. 3, 1994, now Pat. No. 6,274,950.

(51) Int. Cl.
*H02J 7/00* (2006.01)

(52) U.S. Cl. ........................................................ 307/66
(58) Field of Classification Search ..................... 307/66
See application file for complete search history.

(56) References Cited

U.S. PATENT DOCUMENTS 6,274,950 B1 * 8/2001 Gottlieb et al. ............... 307/66

* cited by examiner

*Primary Examiner*—Rober L. DeBeradinis
(74) *Attorney, Agent, or Firm*—Townsend and Townsend and Crew LLP

(57) ABSTRACT

An uninterrupted power supply ("UPS") system is disclosed which uses a battery communication system to communicate to a UPS processor information concerning the status of a battery pack in an array of parallel coupled battery packs. The battery packs provide back-up power for the UPS system. Information about the battery packs is collected by a monitor associated with each of the battery packs. The monitors measure battery pack voltage, currents and temperature and compile information about the battery pack from the measured values. Each monitor prepares a data word representing information about its battery pack. The data. words are transmitted to the UPS in response to commands issued by the UPS processor to the monitors.

15 Claims, 8 Drawing Sheets

BATTERY COMMUNICATION SYSTEM

CROSS-REFERENCE TO RELATED ACTIONS

This application is a continuation application under 37 CFR § 1.53(b) of application Ser. No. 11/090,731, filed on Mar. 25, 2005, now U.S. Pat. No. 7,199,489, which is a continuation of application Ser. No. 10/784,329, filed on Feb. 23, 2004, now abandoned which is a continuation of application Ser. No. 09/864,037 now U.S. Pat. No. 6,803,678, filed on May 23, 2001, which is a continuation of application Ser. No. 08/205,527 now U.S. Pat. No. 6,274,950, filed on Mar. 3, 1994, entitled BATTERY COMMUNICATION SYSTEM.

This invention relates generally to battery-back up systems for supplying alternating current ("AC") or direct current ("DC") power to electrical loads. More particularly, this invention relates to methods and apparatus for collecting information on the status of one or more back-up batteries and communicating the information to the users of uninterruptable power supply ("UPS") systems.

There are numerous types of UPS systems for supplying backup AC or DC power to a load with batteries or other energy storage devices. The back up power is required when power from an AC power source is performing outside of acceptable limits or fails completely. UPS systems that supply AC power to an AC load, as a back-up to an AC power source, are referred to herein as AC to AC ("AC-AC") class UPS systems. Those that supply DC power to a DC load, as a back up to an AC power source, are referred to as AC to DC ("AC-DC") class UPS systems.

Prior art battery back-up systems have used one very high voltage battery pack made up of a number of series connected 12 volt automobile batteries, for example. This battery pack is not very reliable for a power back-up system because the whole battery pack is lost if one of the batteries fails and creates an open circuit. It is known to use parallel coupled battery packs to avoid the foregoing problem but even when one of these battery packs fail it is time consuming to identify the particular one or two or more battery packs that require replacement.

Furthermore, in prior art battery pack back-up systems it has been complicated to collect and process battery pack voltage and charge and discharge currents for evaluating the individual battery packs whether connected in series or parallel.

The present invention overcomes the limitations of prior art battery back-up systems by coupling a digital data processor to one or more batteries or battery packs. The processor is used to gather information about the status of an individual battery pack and report the information to a user by setting off an alarm. The battery pack information is also made available for viewing on an LCD display. In addition, a communication system is created among at least a single battery pack and a main processor associated with the power control circuit of a UPS system.

Accordingly, it is an object of the present invention to employ digital processors with a battery to gather information about the battery including whether it is over heating, needs replacement, is capable of being charged, is at float voltage and whether it is a good battery capable of supplying full power to a load.

Another object of the invention is to identify a battery in a group of batteries that requires replacement by coupling a light emitting or an audio alarm to each battery in the group.

Still another object of the invention is to communicate battery information collected at a battery to a remotely located digital processor such as the processor used in the power control circuit of a UPS system.

It is another object to integrate battery pack information into the computer system administrating a UPS system having battery packs for power back-up.

Yet another object of this invention is to enhance the performance of battery packs in UPS systems used with computer, telephone, process control and other down time sensitive electrical loads where loss of power means loss of information or service.

Additionally, it is an object to enable a UPS system processor to communicate with a monitor associated with each battery in a group of one or more batteries which are providing back-up power to an electrical load.

Finally, it is an object of the invention to detect a battery pack among a group of battery packs electrically coupled together that requires service and to notify users in advance of trouble so there is time to service the battery pack, for example, by replacing it with another battery pack.

SUMMARY

The foregoing and other objects of this invention are realized by the presently disclosed embodiment of a UPS system. The disclosed UPS system is for an AC-AC class system. It is adaptable for use in an AC-DC class UPS system and with a stand alone group of back-up batteries or battery packs. The UPS system uses a power control circuit of the type having a multi-tap transformer to pass power from an AC power utility source to an electrical load. An AC line sensor is coupled to the AC source load to monitor for over and under voltage conditions in addition to total loss of the line source. A UPS processor is coupled to the line sensor and the transformer to electrically select particular taps on the primary winding to compensate for under and over voltage conditions. A triac power switch is also coupled to the line source and the UPS processor. The processor de-energizes the triac when it detects that the AC line is about to fail to disconnect the UPS system from the line. When the AC source comes back on the line sensor senses the event and signals the processor to switch the triac to reconnect the AC source to the transformer.

The power control circuit includes a MOSFET bridge that is coupled to a tertiary winding of the transformer and to the plus and minus voltage buses connecting a group of 48 volt battery packs coupled together in parallel. The UPS processor supplies 30 khz (approximately) signals to the gates of the MOSFETs in the bridge to convert the 48 volts DC supplied by the battery packs to about 48 volts 60 hz AC. The bridge also functions to convert the 48 volt AC power developed in the tertiary winding by the AC line source to 48 volt DC for charging the battery packs.

Battery monitors are packaged inside the housing of each battery pack. Processors on the monitors receive battery pack voltage and charging and discharging current information. A shunt resistor which is part of the monitor is coupled in series with each battery pack. The voltage and current information along with ambient temperature information are processed by the monitor processor and an information packet is transmitted to the UPS processor. Telephone handset lead line and male and female handset RJ-22 connectors are used to couple the UPS processor to the monitors associated with each of the battery packs.

The UPS processor issues commands to the monitors which regenerate the commands and send them along to the other monitor. Simultaneously with the receipt of the UPS command, the monitors send battery pack information back to the UPS processor. Commands are transmitted to the monitors until the UPS processor detects that it is no longer receiving information back. The UPS processor gathers the information and provides it to an LCD display upon user request entered with a three key keypad or upon the request of a system administrator from a supervisor computer over a local area network or other communication resource.

THE DRAWINGS

The foregoing objects and other benefits and features of the present invention will be even more clearly understood from a further reading of the specification together with reference to the drawings which are:

Figure 8:
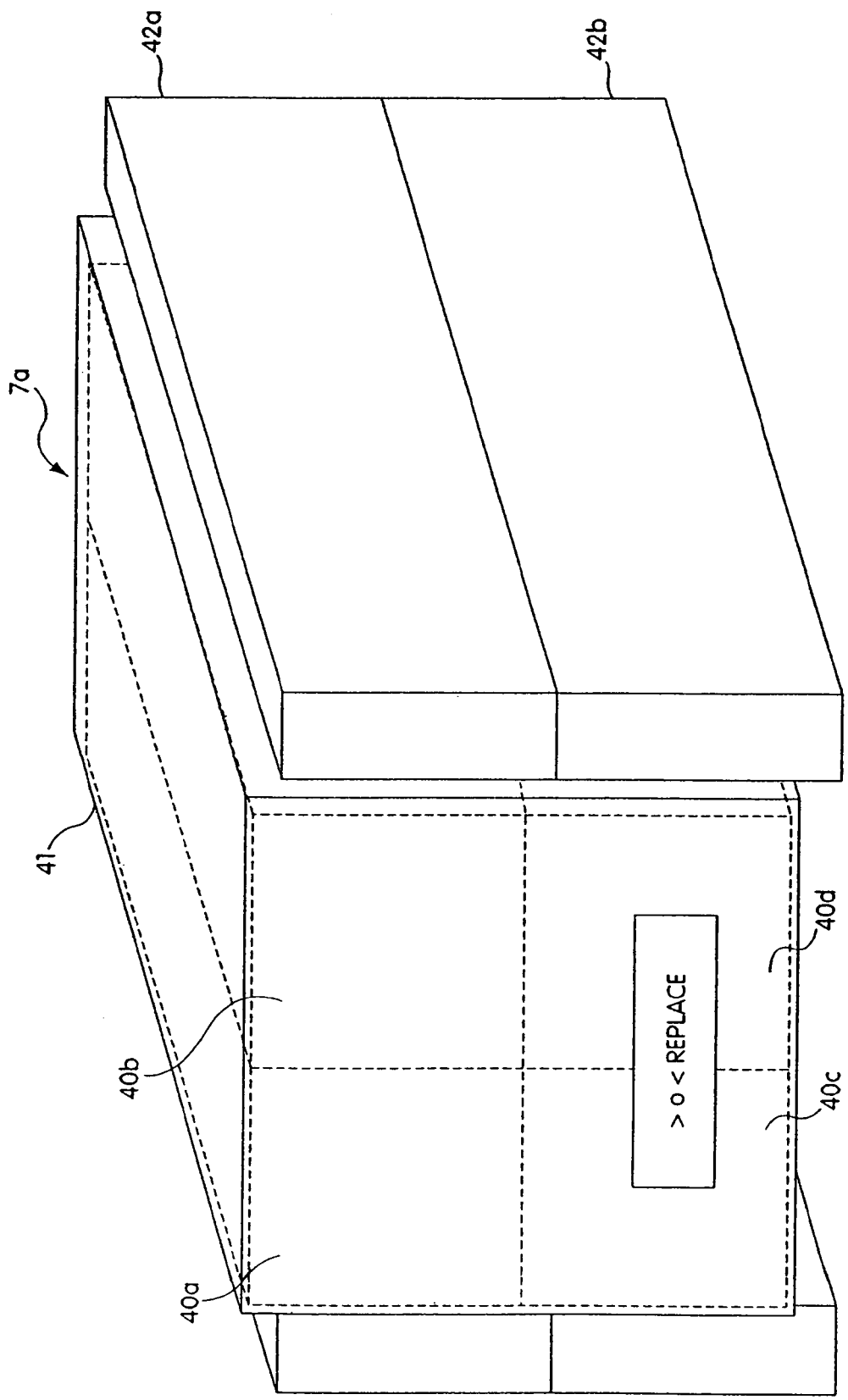

FIG. 8 is a perspective drawing of a battery pack used in the present UPS system. The dashed lines in the drawing represent the four individual batteries within the battery pack housing. Each of the four batteries are wired together in series to provide a 48 volt output across the battery pack anode and cathode.

DETAILED DESCRIPTION

Figure 1:
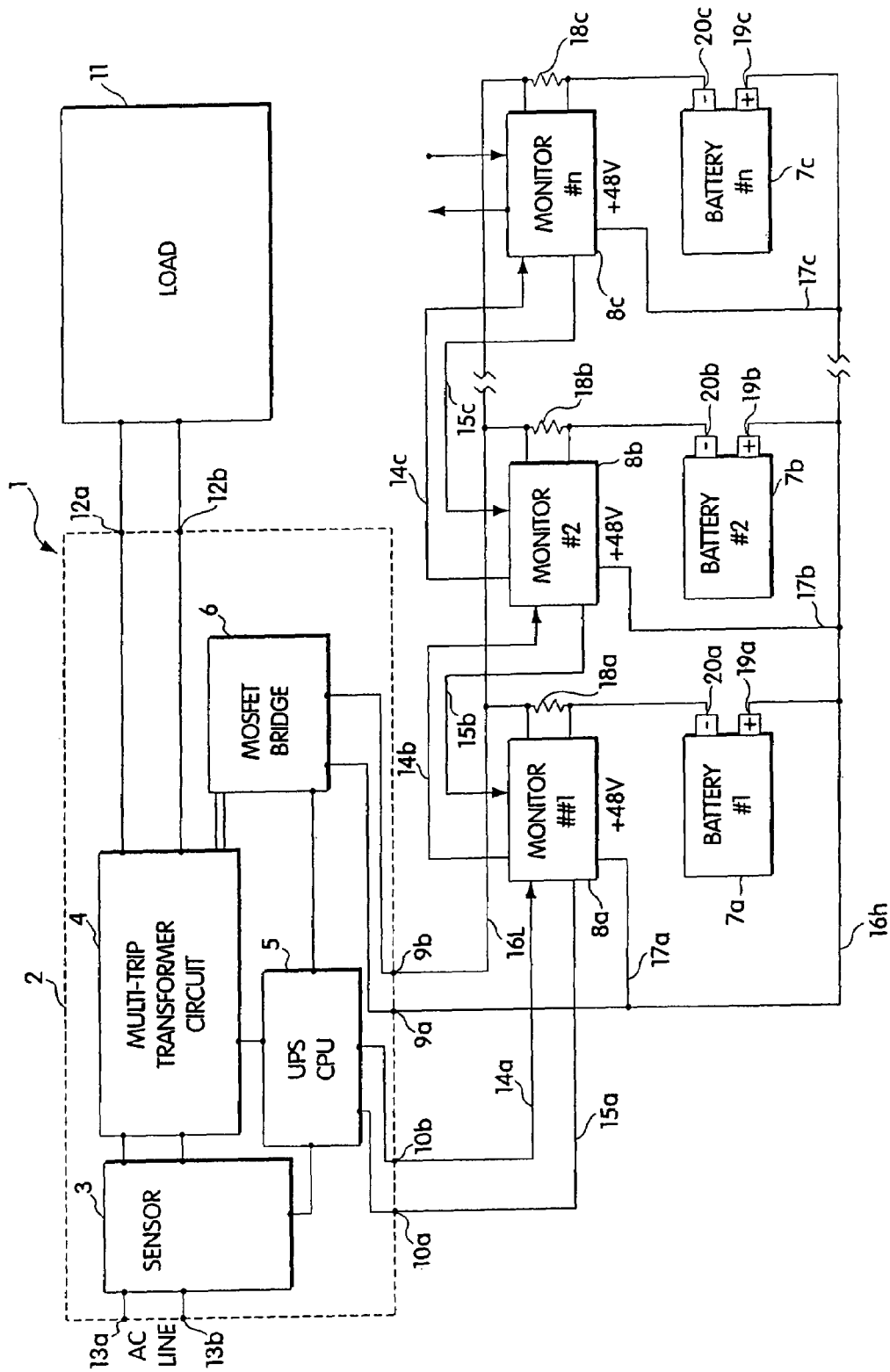
FIG. 1 is a schematic block diagram of the UPS system employing the novel battery communication system of the present invention.

FIG. 1 shows the novel battery communication system of the present invention in combination with an AC-AC class UPS system. The UPS system employs power control circuits including a multiple tap isolation transformer, a processor and a MOSFET transistor bridge circuit. The power control circuit is one example of an inverter/charger circuit. The disclosed battery communication system may be used in combination with both AC-AC and AC-DC class UPS systems and within each class with systems that employ other power control circuit types in place of the specific type chosen for use in the embodiment of system of FIG. 1. The UPS system of FIG. 1 is representative of all such variations of UPS system classes and types.

The UPS system 1 in FIG. 1 includes a housing 2 containing a power control circuit which includes a power sensor circuit 3, a switching transformer circuit 4, a UPS processor or cpu 5 and an MOSFET transistor bridge circuit 6 (an inverter/charger circuit). The UPS system further includes the array of parallel coupled, battery packs (or units) represented by battery packs 7a, 7b and 7c and a plurality of battery monitors 8a, 8b and 8c.

The UPS cpu 5 in combination with the monitors 8a, b and c and the battery packs which they serve comprise the presently preferred embodiment of a battery communication system. The battery communication system transmits information concerning the status of the battery packs among the monitors and the UPS cpu. The underlying information collected by the monitors includes battery pack charge and discharge current, battery pack temperature and voltage.

The battery units are electrically coupled to the MOSFET bridge at UPS housing terminals 9a and 9b and the monitors are electrically coupled to the UPS cpu 5 at housing terminals 10a and 10b. An electrical load 11 is coupled to the output winding of the multi-tap isolation transformer circuit 4 at UPS output terminals 12a and 12b. The battery units 7a, b and c are specifically located outside housing 2, in contrast to prior art UPS systems, to isolate them from heat generated by the electrical components within the housing and to facilitate the addition of extra battery units to the array and/or the removal of one or more battery units, e.g. a battery pack requiring service.

Referring to FIG. 1, the array of battery packs 7a, b and c are coupled together by the +48 bus line 16h and the ground bus line 16L. The buses 16h and 16L are coupled to the MOSFET bridge 6 at terminals 9a and 9b of the housing 2. The bridge 6 provides charging current to battery packs 7a, b and c when the AC line source is supplying power to UPS system 1 and to load 11. When the AC line is down, the battery packs provide +48 volts to the MOSFET bridge which it uses to generate 48 volt 60 cycle power which is coupled to load 11 though transformer 4.

The battery communication system extends from the UPS cpu 5 to monitor 8c, the last monitor in the network and the one associated with the last battery pack 7a in the array of parallel battery packs. The lead lines 14a, b and c comprise a command communication path from the UPS cpu 5 to monitors 8a, b and c. The lead lines 15a, b and c comprise a data communication path from the monitors 8a, b and c to the UPS cpu 5. Each monitor couples to the +48 voltage bus 16h via lead lines 17a, b and c to obtain battery pack voltage data. The voltage data is used to identify battery packs that are characterized as early good, as requiring service and to determine if a battery pack is at float voltage, i.e. the battery pack is fully charged.

Each monitor 8a, b and their associated battery packs 7a, b and c are coupled between the +48 volt bus 16h and the ground bus 16L. Each monitor includes a shunt resistor 18a, b and c which is coupled in series with the associate battery pack 7a, b or c at cathodes 20a, b and c. The anodes of the battery packs 7a, b and c are all coupled to the +48 volt bus 16h and one end of each shunt resistor 18a, b and c is coupled to the ground bus 16L.

Software control programs in UPS cpu 5 and in each monitor processor 64 (see FIG. 3), discussed later in connection with FIGS. 4, 5, 6 and 7, make use of the communication paths established between cpu 5 and monitors 8a, b and c.

Functionally, UPS system 1 of FIG. 1 couples an AC power source such as a public utility or other power source at its input terminals 13a and 13b to electrical load 11 at the output terminals 12a and 12b of the system. The power passed to the load is conditioned by the UPS system power control circuit if required to compensate for fluctuations in the AC source. The conditioning is accomplished, among other ways, primarily by switching the ratios of transformer windings passing power to the load.

A further function of the UPS system is to disconnect the AC line source at the UPS input terminals 13a and b the moment that the UPS system detects that the AC source has failed or fallen outside acceptable levels. On those occasions, the UPS system open circuits the connection to the UPS input terminals 13a and b and supplies AC power to load 11 generated by the battery packs 7a, b and c in concert with the UPS cpu 5 and MOSFET bridge 6. Similarly, the moment the AC line source is restored to acceptable levels, the UPS system reconnects the AC source at input terminal 13a and b though to the load 11. The UPS system is powered by the battery packs when the line source is down.

The novel battery communication system of this invention increases the reliability of the power support function of the UPS system 1 for load 11. It does so by determining whether one or more of the battery packs 7a, b or c require service, e.g. replacement, while there is time to do so because AC line power is still available or other battery packs can supply the load while a battery is being serviced. Each monitor 8a, b and c includes a light emitting diode ("LED") which emits light to indicate that the battery it is monitoring requires service, e.g. replacement of a bad battery. A bad battery is one that is incapable of being recharged. The light emitted by the LED specifically identifies a battery pack requiring service which is otherwise difficult to locate within the battery array.

Figure 2:
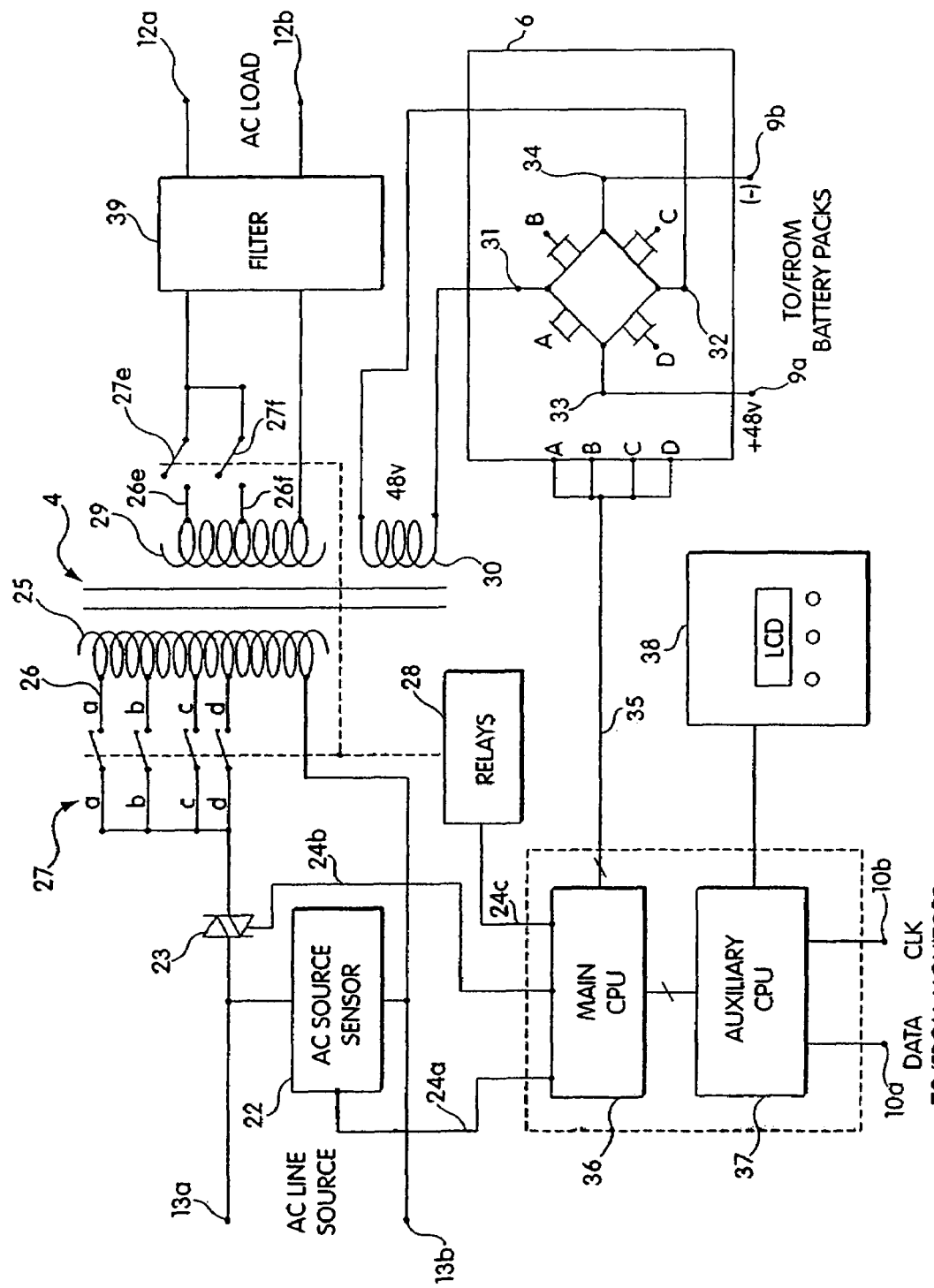
FIG. 2 is a schematic diagram of the power control circuit of the UPS system of FIG. 1 but including more detail.

The monitors are coupled to each other and to the UPS cpu in a manner permitting battery information to be passed to the UPS CPU 5 for, among other purposes, display of a "replace battery" or other service request message on a UPS display screen (see FIG. 2, reference number 38). The battery data stored at the UPS cpu 5 is also accessible for interrogation by a remotely located computer over a local and/or wide area network ("LAN" or "WAN").

The UPS system of FIG. 1 is representative of commercial versions of UPS systems marketed by American Power Conversion Corporation, the assignee of this application, under the trade name Matrix UPS systems. The Matrix UPS systems are available in 3000 volt-amp and 5000-volt amp versions which generally define mid-size UPS systems. The battery packs (or units) used in the Matrix UPS systems are sold under the trademark "Smart Cell". Each Smart Cell includes a monitor and a LED. (See FIG. 8 discussed later.)

The system described and claimed herein is not limited to use with mid-size loads but can be scaled up or down to accommodate other load requirements.

UPS system 1 is particularly suited for loads such as personal computers, servers and minicomputers and is compatible with virtually all computer network software operating systems including NetWare available from Novell, Notes from Lotus Corporation, OS/400 and OS/2 from IBM and VAX/VMS from Digital Equipment Corporation.

Referring now to FIG. 2, the features of the UPS power control circuit are shown in greater detail. The power control circuit includes the AC source sensor 22, a device for sensing conditions of the AC line source including when the line source is lost and when the voltage is low or high. The sensor 22 detects line voltage, phase, frequency and current. When the AC line source fails, the triac 23 is switched by UPS cpu 5 thereby isolating the UPS system from the line source. (In FIG. 1, the functions of sensor 22 and triac 23 are represented by the single device, sensor 3.) The Sensor and triac are coupled to UPS cpu 5 by lead lines 24a and b.

The primary winding 25 of transformer 4 is shown with four taps 26a, b, c, and d which are connected to the moveable switch arms 27a, b, c and d coupled to a bank of relays 28. The relays are connected to the UPS cpu 5 over line 24c. For normal AC source line values, sensor 22 signals CPU 5 to cause the relay bank 28 to close switch arm 27c coupling it to tap 26c. This is a nominal tap position intended to couple current to load 11 into the secondary winding 29 adequate to provide AC voltage and current substantially equal to that presented to the primary winding.

In an overvoltage AC line condition, sensor 22 signals cpu 5 to cause relay bank 28 to close switch arm 27d to select winding tap 26d. Tap 26d creates a winding turn ratio between the primary and secondary windings that reduce the overvoltage to a normal voltage level in the secondary winding. Conversely, during undervoltage line conditions, a "brownout", cpu 5 operates the relay bank to close either relay arm 27a or b depending upon the magnitude of the undervoltage. Taps 26a and b select a winding turn ration that causes the transformer to increase the current and voltage appearing at the secondary winding to normal levels. The secondary winding 29 is coupled to the UPS output terminals 12a and b and the load 11 and includes secondary taps 26e and f and switch arms 27e and f one of which is selected to switch the output from 220 volts to 110 volts, for example.

Switching transformer 4 also includes a tertiary winding 30 which is coupled to the north 31 and south 32 taps of the MOSFET bridge 6. The winding turn ratio between the primary and tertiary windings is selected to provide a voltage in the tertiary winding to be effectively the bus voltage of the array of battery packs 7a, b and c. In the case of UPS system 1, 48 volts is the desired battery bus voltage level. The east 33 and west 34 taps of the MOSFET bridge are coupled to the UPS housing terminals 9a and b and in turn to the battery pack bus lines 16h and 16L.

UPS cpu 5 controls the operation of the MOSFET bridge by applying signals to the gates (identified as A, B, C and D) of the individual MOSFETs in bridge 6 at a prescribed frequency that is several magnitudes higher than the AC line 60 cycle frequency, e.g. 30 Khz.

Cpu 5 is implemented with two processors, the main cpu 36 and the auxiliary cpu 37. The two CPUs are tightly integrated to operate as one processor. CPU 37 shares CPU 37's system clock and is coupled directly to its data and address buses. The main cpu includes a control program appropriate to control the transformer 4, bridge 6, triac 17 and the bank of relays 23 in response to inputs from the AC line sensor 22.

The auxiliary cpu 37 contains a control program that; communicates with the control program of main cpu 36; operates the LCD display 38; manages the communications with the battery monitors 8a, b and c; and sends messages to the LCD display relating to battery service requests and other battery related information provided by the monitors and main CPU 36.

The Battery Monitors

Figure 3:
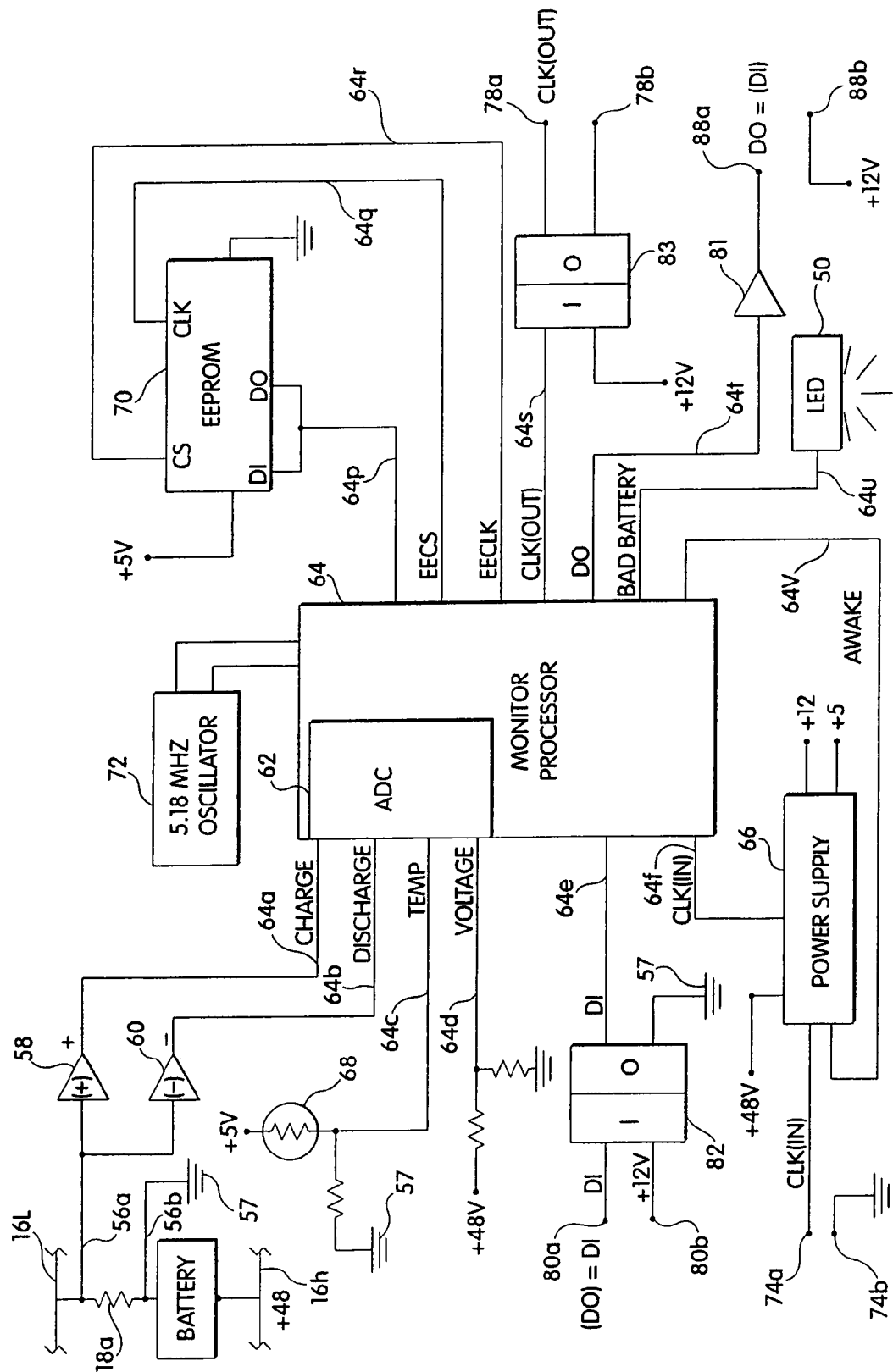
FIG. 3 is a schematic block diagram of a battery pack monitor of the present invention.

The battery monitors 8a, b and c of FIG. 1 are more fully defined by the schematic drawing of FIG. 3. The battery monitor of FIG. 3 is representative of all the monitors 8a, b and c. Monitor 8c represents the "n th" monitor attached to the highest numbered or nth battery pack 7c in the array of battery packs. The function of each monitor is the same regardless of its position in the battery communication system which extends logically and physically from the UPS cpu 5 outward to monitor 8c, the last monitor in the daisy chain.

The monitor of FIG. 3 is described using the reference numbers associated with monitor 8a, the first monitor in the daisy chain Monitor 8a is coupled to UPS cpu 5 (more specifically, to CPU 37) via CLK command line 14a and data line 15a (see FIG. 1).

Referring briefly to FIG. 1, each battery pack is coupled in series with a precision shunt resistor 18a, in the case of battery pack 7a. The electrical resistance value of the shunt is 0.00025 ohms which provides a voltage drop across it of fifty millivolts under the expected maximum charging and discharging currents of plus or minus 200 amps. The shunt is therefore a current sensor for monitor 8a. The shunt is made with Maganin-13, a special alloy designed for this purpose and having a low temperature coefficient of resistance. The plus or minus fifty millivolt drop across the shunt is compatible with the tolerances of the semiconductor components of monitor 8a. The shunt resistor is physically mounted on the battery pack 7a under discussion and is treated herein as an element of the monitor. The majority of all other components of the monitor 8a are contained on a small printed circuit board.

The monitor 8a includes electrical lead lines 56a and b which are coupled to the ends of the shunt resistor 18a as shown in FIG. 1 and FIG. 3. Lead line 56a is coupled to the inputs of the non-inverting and inverting, respectively, amplifiers 58 and 60. Lead line 56b is coupled to a local ground 57 on the printed circuit board of monitor 8a. Lead line 56a is coupled to both preamplifiers 58 and 60 to provide separate input channels for detecting and measuring the discharging and charging currents associated with battery pack 7a.

The outputs of preamplifiers 58 and 60 are coupled to the analog to digital converter (ADC) section 62 of the monitor processor 64. Processor 64 is the digital processor or controller for the monitor and includes several analog signal input ports including input ports 64a,b,c and d. The charging and discharging currents from the outputs of preamplifiers 58 and 60 are applied to ports 64a and b, respectively. The +48 volt bus voltage on bus line 16h is applied to processor input port 64d. The +48 bus voltage is also coupled to the power supply 66 which supplies +5 and +12 voltage levels for operation of monitor 8a. An ambient temperature signal produced by the thermistor 68 is applied to processor port 64c. The four signals applied to ports 64a,b,c, and d are in an analog data form.

The ADC section 62 of processor 64 converts the analog data into a digital data format. Processor 64 is a Philips/Signetics 87C752 programmable controller, the specification of which, available from the maker, fully describes its operation. The software control program stored in internal read-only memory ("ROM") of processor 64 controls the operation of the processor to achieve the described functionality for monitor 8a. The control program is discussed in detail below and the monitor source code and relevant sections of the UPS cpu 5 control program are listed in full in the microfiche appendix hereto.

Processor 64 also has digital input data ports, two of which are identified by reference numbers 64e and f. Input port 64e on monitor 8a receives digital battery pack data from its adjacent neighbor, monitor 8b, and from all the other monitors in the daisy chain out to monitor 8c. The battery data transmitted from monitor to monitor includes a packet of ten data bits referred to herein as a battery data word.

Input port 64f of monitor 8a receives a command signal directly from UPS cpu 5 in the form of a digital clock signal ("CLK"). Processor 64 on monitor 8a immediately re-issues the CLK signal to monitor 8b thereby propagating the CLK command to successive monitor processors in the chain. Each CLK command in a string of commands propagated along the daisy chain cause one bit of each monitor's data word to be moved to or toward UPS cpu 5. The UPS cpu 37 issues CLK signals until it stops receiving valid data bits which signals that all the monitors have transmitted their data words.

The digital output ports of processor 64 include ports 64p, q, r, s, t, u and v Processor output port 64p issues write and read commands to EEPROM 70 to store and retrieve data relating to battery pack 7a. The ports 64q and 64r are issue processor 64 generated chip select (EECS) and clock (EE-CLK) signals to the BEPROM. Data is shifted into and out of the EEPROM serially under the control of the EECLK signals and commands.

The CLK command is issued by the processor at port 64s in response to the receipt of the CLK command at input port 64f. The CLK command is transmitted from monitor 8a to monitor 8b, the next one out in the daisy chain, through the optical isolator 83 and over CLK command line 14b. Thereafter the CLK command passes to successive monitors in the daisy chain in the same manner.

The battery pack data output port 64t forwards battery data, DO, information associated with battery pack 7a directly to UPS cpu 5. Monitor 8a simultaneously receives battery data, DI, at input port 64e, one bit at a time, from monitor 8b in response to each successive CLK command. The battery data associated with successive monitors in the daisy chain are similarly shifted by the CLK command through monitor 8a to UPS cpu 5.

Output port 64u issues a signal to activate or deactive light emitting diode ("LED") 50. The LED emits light detectable by the human eye to indicate that the battery pack 7a associated with monitor 8a requires service, for example replacement.

Output port 64v issues an AWAKE signal to power supply 66 to keep the power supply turned "on" after it is initially activated. Processor 64 also uses the AWAKE signal to shut down monitor 8a, i.e. turn the monitor "off" and does so by deactivating the AWAKE signal.

Power supply 66 in monitor 8a is initially turned "on" by a series or burst of one or more CLK commands which alone or collectively attempt to charge a bias capacitor in the input section of the power supply. The lead line carrying the CLK pulse to port 64f passes through the power supply. To insure that the power supply in every monitor is activated, the series of CLK commands are immediately followed by a "long pulse" command (also referred to as the wakeup pulse). The CLK commands and the long pulse are issued by UPS cpu 5 once every second as long as the UPS system itself is operational. UPS cpu 5 issues the CLK commands at a rate of 1,000 hz.

The burst of CLK pulses ends when UPS cpu 5 detects that the data from the last monitor, monitor Bc, has been received. The long pulse follows the last CLK command in the burst and remains asserted until the expiration of a timer in UPS cpu 5 that creates a guard period between the end of the long pulse and the end of the one second cycle. Consequently, the "one second cycle" followed by UPS cpu 5, will be longer than one second when the number of monitors in the daisy chain is large. The number at which that occurs is related to the number of CLK commands needed to shift data from the "nth" or last monitor all the way to UPS cpu 5. At some number of monitors, the length of the CLK command string, the duration of the long pulse and the guard period will exceed one second. UPS cpu 5 manages this in a manner as discussed below.

Each monitor processor 64 has an internal timer that measures the duration of the CLK commands received at processor input port 64f. The internal timer is used to filter noise and for verifying the presence of a long pulse at CLK input port 64f. However, when a long pulse is at input port 64f, Processor delays the generation of the trailing edge of the CLK command and thereby regenerates the long pulse at output port 64s. This process is repeated along the daisy chain thereby propagating the long pulse, or wake up pulse, to all successive monitors in the battery communication system.

The long pulse turns the power supply 66 "on" in each of the monitors 8a,b, and c if the first burst of CLK commands failed to do so. The duration of the long pulse insures that a capacitor within the power supply is adequately charged to switch a gating transistor that couples the +48 bus voltage 16*h* to appropriate voltage dividers, one variable voltage regulator and two fixed voltage regulators within the power supply once the power supply is on.

The AWAKE signal is part of a "watchdog" function which causes the processor 64 to go through a start up cycle if the initial attempt to start the processor fails. The watchdog function, a subroutine of the processor 64 control program also causes the processor to initiate a new start up cycle, including initializing the power supply, if the processor fails to properly execute its control program.

The processor 64 control program includes a thirty-two second internal timer that begins running after the last CLK signal is received at port 64*f*, for example, after UPS system shuts down. Upon expiration of the thirty-two second timer, the AWAKE signal is removed from port 64*v* and therefore from power supply 66 shutting down the entire monitor. The thirty-two seconds prior to shut down provide time for the processor to complete program routines in progress including one that stores the battery status information in EEPROM 70.

The discussion now turns to the optical isolators 82 and 83 coupled to the monitor data input terminals 80*a* and *b* and the monitor CLK output ports 78*a* and *b*, respectively. Because of large currents present during charging and discharging of the battery packs 7*a, b* and *c*, optical isolators 82 and 83 are placed in series with the command lines 14*a, b* and *c* and the battery data lines 15*a, b* and *c* to prevent ground loops.

The CLK command path through monitor 8*a* begins at the monitor CLK input terminals 74*a* and *b*. Input terminal 74*b* is grounded while terminal 74*a* is coupled to processor input port 64*f* through power supply 66 as discussed above. The CLK path continues at processor output port 64*s* which is coupled to one of two inputs to optical isolator 83. The other input to the isolator is coupled to +12 volts. The two outputs of the isolator 83 are coupled to the two monitor CLK output terminals 78*a* and *b*. The terminals 78*a* and *b* are coupled to the CLK input terminals 74*a* and *b* of monitor 8*b*, the adjacent neighbor of monitor 8*a* presently under discussion. Similarly, the UPS cpu 5 which sends out the CLK command includes an optical isolator 83 at its output which couples to monitor 8*a* terminals 74*a* and *b*.

Likewise, except that data passes through a monitor in the opposite direction to the CLK and long pulse commands, data from monitor 8*b* enters monitor 8*a* at data input terminals 80*a* and *b* both of which are coupled to the input of optical isolator 82. One of the outputs of isolator 82 is coupled to processor input port 64*e* and the other is coupled to ground 57. Data passes through the processor to output port 64*t* which is coupled to amplifier 81 before reaching data output terminal 88*a*. The second data output terminal 88*b* is coupled to +12 volts. Data output terminals 88*a* and *b* are coupled to data input terminals 80*a* and *b* in UPS cpu 5, an adjacent neighbor of monitor 8*a*.

Command lines 14*a, b* and *c* and data lines 15*a,b* and *c* are implemented as a wire pair in a standard telephone hand set lead line comprising two wire pair (i.e. four wires) terminated at each end with standard telephone hand set, male, 4 pin RJ-22 connectors. The male RJ-22 connectors at the ends of the combined command and data lines mate with female connectors on the monitors 78*a, b* and *c*. One wire pair in lead line 14*b* connecting monitors 8*a* and 8*b* are connected to the CLK output terminals 78*a* and *b* on monitor 8*a* and to the CLK input terminals 74*a* and *b* on monitor 8*b*. The other wire pair in the lead line 14*b* connecting monitors 8*a* and 8*b* are connected to the data input terminals 80*a* and *b* on monitor 8*a* and to the data output terminals 88*a* and *b* on monitor 8*b*. The CLK commands move from monitor 8*a* to monitor 8*b* while the data word moves from monitor 8*b* to monitor 8*a*.

The Battery Packs

Each battery pack 7*a, b* and *c* is a 48 volt battery comprising four, twelve volt lead-acid batteries electrically coupled together in series. The battery packs 7*a, b* and *c* are wired in parallel thereby making it possible for continued uninterrupted operation of the UPS system 1 should one of the battery packs need to be replaced. In contrast, prior art UPS systems employ a single, much higher voltage battery pack that includes many smaller batteries coupled together in series. The loss of just one series connected battery creates an open circuit that totally cripples the entire string of batteries thereby depriving a load, such as load 11, of a back up power system.

Another important feature of the UPS system 1 is that the battery packs 7*a, b* and *c* are located outside of UPS housing 2 which encloses transformer 4 and other heat generating components.

Turning now to FIG. 8, the battery packs of the embodiment of FIG. 1 are the foregoing 48 volt lead-acid battery packs which weigh no more than 72 pounds. Other types of batteries based on nickel-iron, ferrous oxide, nickel-cadmium, zinc-air and lithium ion may be substituted for the lead-acid batteries 7*a, b* and *c*. Of course, fuel cells and fly wheels are other energy storing devices that supply energy in electrical form and may supplement or be substituted for the battery packs.

FIG. 8 shows four, 12 volt lead-acid batteries 40*a, b, c* and *d* with two of the batteries 40*a* and *b* stacked on top of batteries 40*c* and *d*. The four stacked batteries of the present invention are electrically wired together in series (not shown in FIG. 8) to provide a 48 volt output across its anode and cathode. The housing 41 enclosing the batteries 40*a, b, c* and *d* is closed but ventilated.

A monitor, e.g. monitor, 8*a* is physically mounted inside the battery pack housing 41. The housing consists of an upper 42*a* and lower 42*b* parts that separate for ease of accessing the batteries 40*a, b, c* and *d* and the monitor 8*a*. The LED 70 is positioned adjacent a window 43 in the housing 41 to allow its light to be seen by users when it is turned on. The parallel voltage buses 16*h* and 16*l* and the telephone lead lines are coupled to the back side of the monitor.

The 72 pound weight of a battery pack is within weight limits permitting overnight shipment with United Parcel Service ("UPS"), Federal Express and other courier services. In fact, replacement batteries are shipped to users over night allowing a failed battery to be replaced within twenty-fours. UPS System 1 users retain the shipping boxes to return failed battery packs back to APCC. This shipping process allows UPS system 1 users to keep a small (and affordable) inventory of the 48 volt battery packs for immediate replacement for any failed battery pack. An unskilled worker can readily be taught to replace a battery pack with one from inventory. The inventory battery pack is replaced by ordering a new battery pack by UPS or Federal Express through a user's normal purchasing channel. This process eliminates the need to purchase a service contract to maintain and dispose of the battery packs.

The Stored Control Program in the Monitor Processors (cpu 64)

Figure 4:
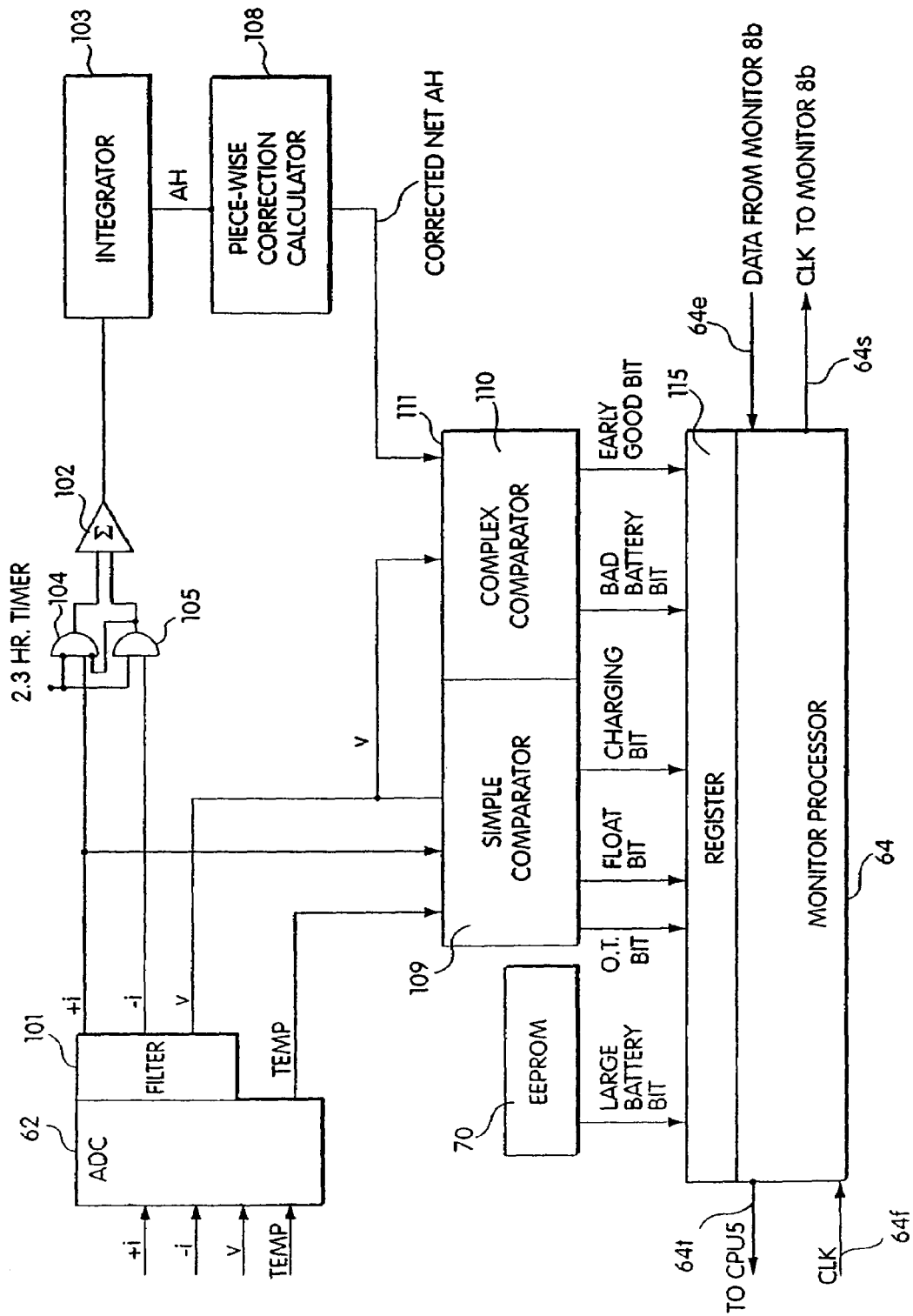
FIG. 4 is a schematic diagram of the functional elements of a monitor processor software control program which compiles a data word representing battery back information sent by the monitors to the UPS processor.

Turn to FIG. 4 which is a schematic diagram of the function performed by the processor 64 under the control of its stored control program. A primary task of the control program is to compile a packet of data for transmission to the UPS cpu 5 and to turn on the LED 50 when the battery associated with monitor 8a requires service. In the presently described embodiment of UPS system 1, the transmitted battery data includes a minimum of six bits that are packaged in a ten bit word, the "data word", which is passed over the battery communication system to the UPS cpu 5. The other bits include a start bit, a parity bit, a stop bit which are supervisory bits and two spare bits available for conveying additional information such as the amphere hour capacity of a battery pack.

The data word is compiled from data derived from charging and discharging currents and the battery pack bus voltage. In addition, the voltage drop across measured thermistor 68 (FIG. 3) is measured to generate information on the ambient temperature of the battery pack. As shown in FIG. 4 (and in FIG. 3), battery pack 8a charging current, +i, the discharging current, −i, battery pack bus voltage, v, and the ambient temperature, Temp, are applied to ADC 62 section of processor 64. The ADC outputs of +i, −i and v are averaged by adding 64 successive readings and dividing the sums by 64. This function is represented as filter 101. The filter performs the averaging to suppress noise associated with the hardware.

The filtered ADC outputs +i and −i are algebraically summed by the summing amplifier 102 and passed to the integrator 103 provided the 2.3 hour logic gates 104 and 105 have indicated that 2.3 hours have elapsed since monitor 8a has been on and have detected charging and discharging current. In addition, the output of gate 105 is fed to the input of gate 104 to represent that the summing process will not begin at amplifier 102 unless a battery discharge has occurred.

The algebraic sum of the current is integrated by integrator 103 which represents the net amphere hours ("amp hours" or "AH") delivered by the battery pack 7a to load 11. The amp hour output of integrator 103 is applied to a piecewise, non-linear correction calculator 108 to compensate for large battery currents which non-linearly reduce the overall capability of a battery pack to deliver power. The corrected net amp hour calculation is used to perform two tests on battery pack 7a: the test for generating the "early good bit" in the data word and the test for generating the "bad battery bit" indicating that battery pack 7a is in need of service, i.e. requires replacement. The corrected, net amp hour output is applied only to the complex comparator section 110 of comparator 111.

The other inputs to comparator 111 include the temp output, the +i charging current output and the v or voltage output of the ADC 62. The voltage v is applied to both the simple comparator and complex comparator sections 109 and 110 of comparator 111. The simple comparator section 109 compares: the temp input value to a temperature threshold value, e.g. 45 degrees Celsius ("C") and generates the "over temperature bit" if the threshold is equaled or exceeded; the +i charging current input value to a current threshold value, e.g. +2.4 amps and generates the "charging bit" if the threshold is equalled or exceeded; the v (voltage) input to a float voltage threshold value, e.g. 54 volts and generates the "float bit" if the threshold is equalled or exceeded.

The complex comparator section 110 generates the "early good bit" by comparing the corrected net amp hours input from calculator 108 to the bus voltage v input from the ADC 62. The complex comparator first compares the input v to a bus voltage threshold value, e.g. 52 volts, and proceeds to a second comparison if the bus voltage v is equal to or greater than the threshold value. The second comparison is a comparison of the corrected net amp hour input to a threshold value, e. q. 5 AH, and proceeds to generate the "early good bit" if the corrected net amp hour input from calculator 108 is equal to or greater than the threshold value.

To generate the "bad battery" bit, the complex comparator 110 makes multiple comparisons or tests of the corrected net amp hour input relative to bus voltage inputs v. If any of these multiple tests fail, the "bad bit" is generated. To begin the first test, the complex comparator 110 compares the v input to a first threshold value, e.g. 45 volts, and proceeds to a second comparator if the v input from the ADC 62 equals or exceeds the threshold value. The second comparison compares the corrected net amp hours input to a first amp hour threshold, e.g. 2 AH, and proceeds to generate the "bad bit" if the corrected net amp hours is less than the threshold. The second, third and fourth tests are the same with the bus voltage v being compared to four other threshold values, e.g. 43, 41 and 39 volts and with the corrected net amp hour input being successively compared to 4, 6 and 8 amp hours.

One additional bit in the data word transmitted to the UPS cpu 5 is the "large battery bit" loaded into the EEPROM 70 at the factory. The large battery bit simply identifies a 48 volt battery pack consisting of four 12 volt, automobile type, lead acid batteries. The zero state of this bit indicates that the battery pack under test is a 48 volt battery pack made up of four 12 volt, lead acid batteries which together weigh 72 pounds, much less than the four automobile batteries.

The output of comparator 111 includes six data bits identified in FIG. 4 which are sent to a register 115 in the processor 64 of each monitor 8a, b and c. The monitor processor control program assembles these six bits with one spare bit, a start bit, a stop bit and a parity bit to make up the data word. The data word is transmitted from a monitor 8a, b or c to UPS cpu 5 in the process described in connection with FIGS. 5, 6 and 7.

Stored Control Code in the Monitor Processors

The control program of monitor processor 64 includes four major code sections: an initialization routine; a main program loop; a timer interrupt service routine; and a communication interrupt service routine.

The Initialization Routine

The initialization routine is run every time a processor 64 is started, i.e., powered up by the on-board power supply 66. The purpose of this routine is to set up the processor for the specific functions required for the initialization routine and for other code sections. Initialization includes setting up or initializing the input and output ports 64a through 64v, the processor internal timers, loading all constants and zeroing scratchpad processor RAM memory and write enabling the EEPROM. In addition, this routine checks if there is an external request to initialize the EEPROM and does so if so requested. This routine also turns on the LED 70 if at an earlier time a bad bit was set to one by monitor 8a, for example, for the associated battery pack 7a.

The Main Program Loop

The main program loop runs nearly all the time that processor 64 is powered up. This section of code is where all the battery data is collected and analyzed. The data word that is transmitted along the daisy chain to the UPS cpu 5 is assembled in this section of code. The data word includes data bits that represent whether the associated battery pack 7a is "early good" or "bad" along with other data bits discussed above in connection with FIG. 4.

Figure 5:
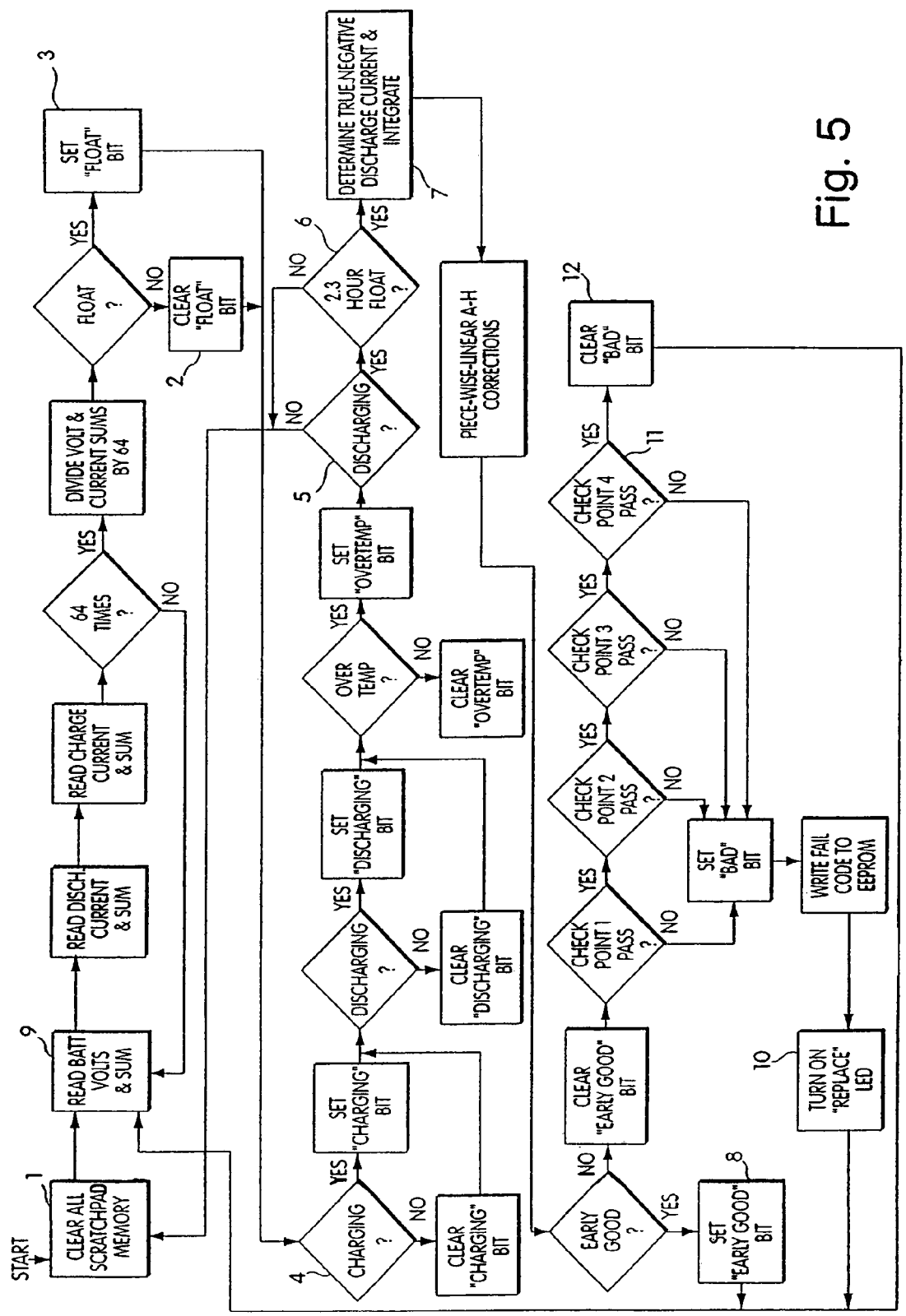
FIG. 5 is a flow diagram illustrating the order of execution of the software control program that processes battery pack data.

FIG. 5 is a flow diagram depicting the execution of the main loop routine. Upon entry, all scratchpad memory locations are initialized to zero. Next, the routine reads battery pack voltage to a first scratchpad memory location and adds the value to a second scratchpad memory location, all of which were initialized to zero at the start of the routine. Similarly, discharging and charging currents are read to scratchpad memory and the values are added to separate locations in the scratchpad. The foregoing three steps are repeated 64 times and the sums are divided by 64. The summing and dividing processes yields average voltage, discharge current and charge current values thereby acting as software filter for compensating for electrical noise associated with the voltage and current readings.

Next, the "float bit", the "charging bit", and the "over temperature bit" are set to a one or zero bit in preparation for compiling the data word. These data word bits along with the "early good" and a "bad battery bit" are generated as described in the above discussion of FIG. 5. The "bad battery" determination is the result of one of four tests on the bus voltage v and the corrected net amp hours as explained above with reference to FIG. 4

The Timer Interrupt Service Routine

The timer interrupt service routine keeps track of all time related events. This interrupt occurs every time the built in timer expires, which has been set by the initialization routine to be every 500 microseconds. This means that this routine is executed 2000 times per second. The functions performed by this routine are: toggle the AWAKE output port 64v (see FIG. 3); detect long pulses (the wakeup pulse) by overriding the pass through pulse width limiter shown and discussed in connection with FIG. 6; detect and act on the 32 second period shutdown timer; write protect the EEPROM; and stop the AWAKE signal to shut down the monitor 8a.

Communication Interrupt Service Routine

The communication interrupt service routine handles all communication between the UPS cpu 5 and the other battery packs. The routine executes whenever the processor 64 detects an incoming CLK command. The immediate response of the processor 64 is to transmit the first bit in a data word to UPS cpu 5 as determined by a state machine. There are 12 states which correspond to the count of an "INDEX" counter. The counter is decremented from a value 11 to zero in response to each CLK command. The particular bit transmitted to UPS cpu 5 is determined by the value of the INDEX counter.

Figure 6:
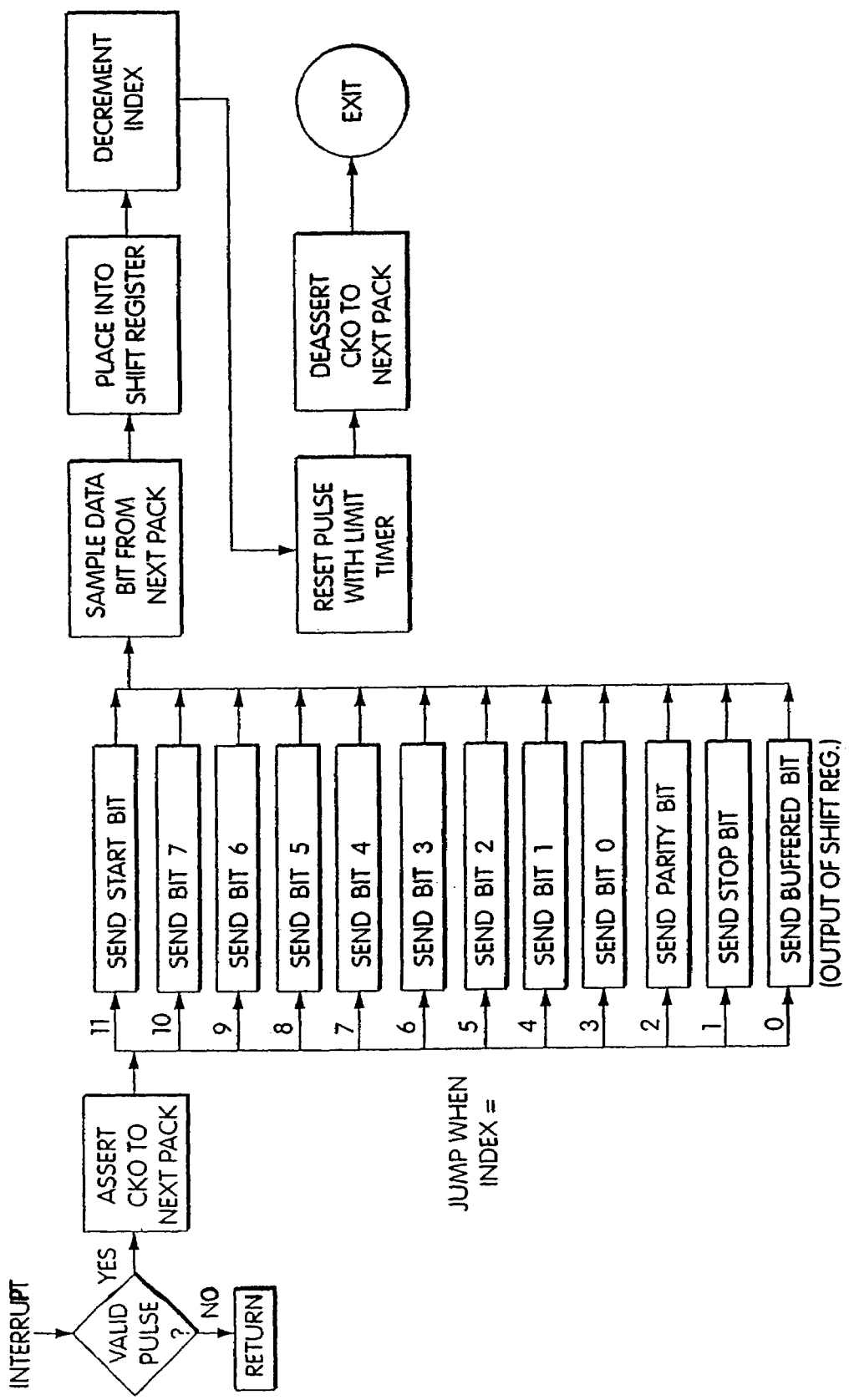
FIG. 6 is a flow diagram of the routine in the monitor software control program that passes information to the UPS processor in response to the receipt of CLK commands from the UPS processor.

Referring to FIG. 6, the flow chart depicts the operation of the communication interrupt service routine. Execution begins when the CLK pulse at processor input port 64f falls from a high to low level (+12 volts to 0 volts) If CLK is low for only a short period, exit the routine because the signal is assumed to be noise. Otherwise, a CLK low level at port 64f, asserts the leading edge of the CLK signal at processor output port 64s, to monitor 8b and all successive monitors in the daisy chain. Based on the value of INDEX, the data word bits are sent in the following order: INDEX 11, the start bit; INDEX 10, the "bad battery bit"; INDEX 9, the "early good" bit; INDEX 8, the "charging bit"; INDEX 7, the "float bit"; INDEX 6, the "overtemperature bit"; INDEX 5, the "deep discharge bit"; INDEX 4, the "large battery" bit; INDEX 3, a spare bit; INDEX 2, the parity bit; and INDEX 1, the stop bit. INDEX 0, the 12th state of the machine, initializes the loop for the receipt of the data word from monitor 8b and successive monitors in the daisy chain out to the last one.

While the data word of monitor 8a is being shifted to UPS cpu 5, the data word of monitor 8b is being received one bit at a time at the processor data input port 64e. The placement of a received bit into a shift register in processor 64 of monitor 8a with decrementing INDEX. In addition, the trailing edge of the output CLK pulse is generated and the communication routine is exited to be restarted upon processor 64 in monitor 8a receiving the next input CLK command. The function represented by the block labeled "Reset pulse width limit timer" in FIG. 6 is inhibited by the processor 64 when a wakeup pulse is detected at input port 64f. Consequently, the wakeup or long pulse command is able to be propagated along the daisy chain of monitors.

The UPS Processor (cpu5) Stored Control Program in the Auxiliary UPS Processor (cpu 37)

The UPS auxiliary cpu 37 stores in internal ROM the control program for managing the LCD display 38 (See FIG. 2), communications with UPS main cpu 36 and 34, communications with the monitors 8a, b and c. The routine for communicating with the monitors gathers and stores status bits relating to battery packs 7a, b and c. The information gathered includes: the total number of battery packs in the array; the number of large battery packs in the array (physically larger than the 72 pound battery packs); the number of battery packs requiring service, e.g. replacement; the number of battery packs reporting a float condition ("float" voltage refers to the inherent, maximum voltage level to which a battery can be charged); the number of battery packs reporting an "overtemperature condition";, the number of battery packs reporting that they are being charged; and the number of battery packs reporting "early good", meaning that a battery pack is substantially fully capable of delivering power to a load.

The routine that handles all battery communication and accounting is located in the timer interrupt service routine of the auxiliary cpu 37 control program. This routine is executed 4000 times per second, or every 250 microseconds. This routine sets the timing of the outgoing CLK command to the battery packs and the return of data bits from the monitors.

Figure 7:
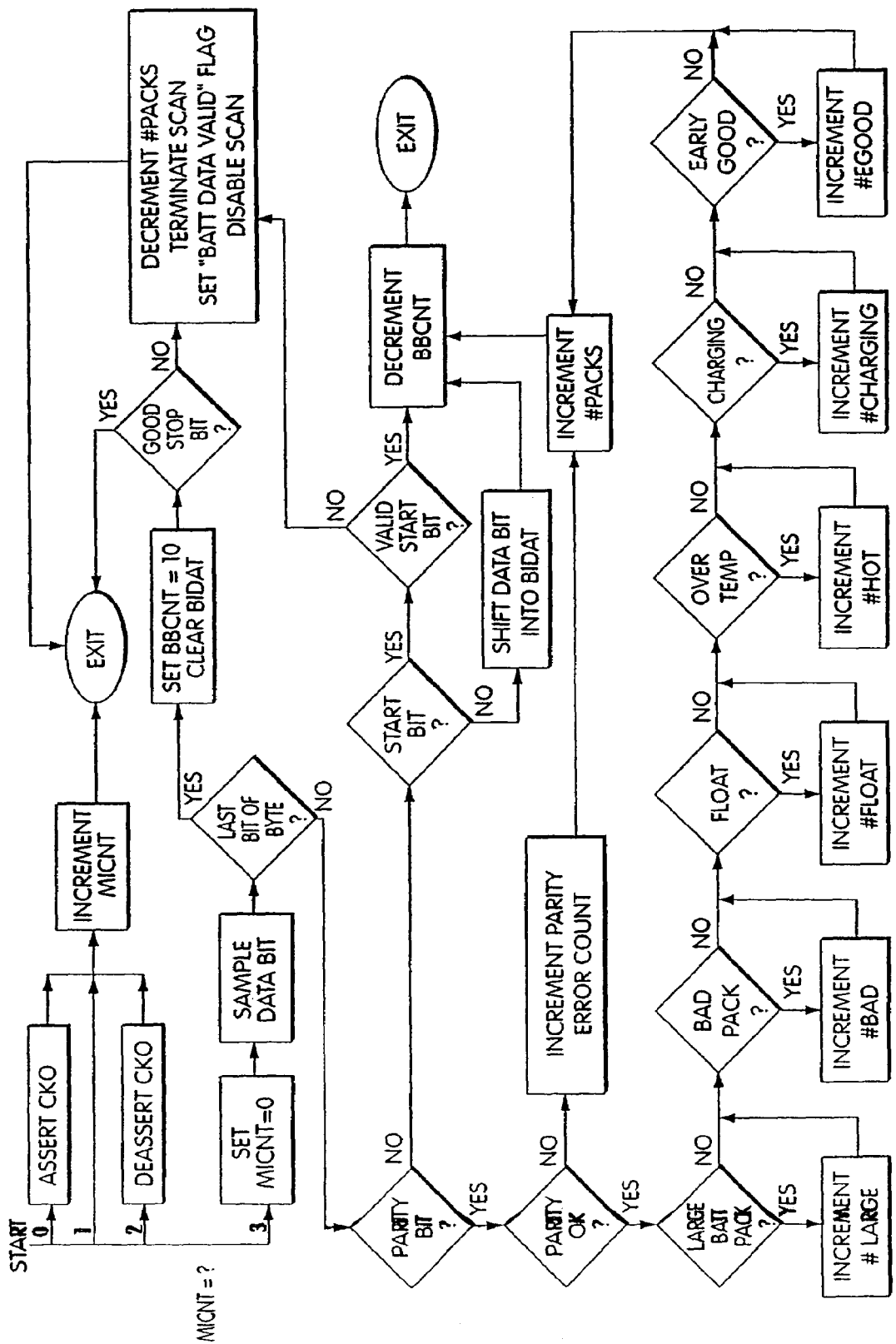
FIG. 7 is a flow diagram of the routine in the UPS processor that issues CLK commands to the monitors, receives and tests the information returned from the monitors for each CLK command and compiles the information for further use.

Referring to FIG. 7, prior to execution of the monitor communication routine, several variables are initialized to specific values. The important ones include: the battery status count is set to zero; the main input counter ("MICNT") is set to zero; the battery bit counter ("BBCNT) is set to 10 decimal; and the battery scan flag is properly set to indicate to UPS main cpu 36 that the auxiliary cpu 37 communication routine is ready. Main cpu 36 enters the communication interrupt loop once every second.

The battery communication and accounting routine, which executes every 250 microseconds, is on the top level of a four state, state machine. FIG. 7 depicts the operation of the communication and accounting routine. A four path state machine is incremented after each execution of this routine. The four functions or states, in proper order, are:
state 0 Assert the leading edge of the CLK pulse to the battery packs;
state 1 No operation, i.e. a delay period;
state 2 Deassert the CLK command to generate the trailing edge of the CLK pulse; and
state 3 Sample, that is receive and read, the data word bits returned from the array of battery pack monitors 8a, b and c and perform the accounting.

States 0 through 2 issue the CLK command to the battery pack monitors 8a, b and c. The gathering and accounting tasks occur during state 3.

Referring to the flow diagram of FIG. 7, the MICNT counter is used to generate the leading and trailing edges of the CLK command in response to three, fixed duration timing pulses issued by main cpu 36 to auxiliary cpu 37. The fourth timing pulse from cpu 36 clears the MICNT counter and the first bit in the data word coming form monitor 8a is read, i.e.

sampled, and stored. The routine is now under the control of the BBDAT counter which controls execution. This defined another state machine that functions as follows (with reference to FIG. 7):

state 10 The first bit received from monitor 8*a* is a start bit. If the start bit is not valid, the battery pack number counter is decremented (implicitedly, by a count of one), the battery pack polling sequence is terminated and the polling or scanning is reported "done" by properly setting a battery data valid flag. Thereafter, the communication routine is exited and control of the scan returns to the main cpu 36 control program. If the start bit is valid, the BBCNT counter is decremented and an exit is made to the cpu 36 program.

state 9 The second bit received from monitor 8*a* is the "bad battery bit" indicating battery pack 7*a* requests service. The communication routine shifts a "one" bit into a battery input data buffer BIDAT if monitor 8*a* is requesting service, else it shifts a "zero" bit into the BIDAT buffer, and, in either case, decrements the BBCNT counter and exits the routine.

state 8 The third bit received from monitor 8*a* is the "early good bit". The communication routine shifts a "one" bit into BIDAT if monitor 8*a* is reporting the presence of an early good battery pack, else it shifts a "zero" bit into BIDAT and, in either case, decrements the BBCNT counter and exits the routine.

state 7 The fourth bit received from monitor 8*a* is the "charging current bit". The communication routine shifts a "one" bit into BIDAT if monitor 8*a* is reporting a battery pack that has been charged, else it shifts a "zero" bit into BIDAT and, in either case, decrements the BBCNT counter and exits the routine.

state 6 The fifth bit received from monitor 8*a* is the "float bit". The communication routine shifts a "one" bit into BIDAT if monitor 8*a* is reporting a battery pack at float voltage, else it shifts a "zero" bit into BIDAT, and in either case, decrements the BBCNT counter and exits the routine.

state 5 The sixth bit received from monitor 8*a* is the "over temperature bit". The communication routine shifts a "one" bit into BIDAT if monitor 8*a* is reporting a battery pack that is too "hot", else it shifts a "zero" bit into BIDAT, and in either case, decrements the BBCNT counter and exits the routine.

state 4 The seventh bit received from monitor 8*a* is the "large battery bit". The communication routine shifts a "one" bit into BIDAT if monitor 8*a* is reporting a battery pack that is the large rather than the small size, else it shifts a "zero" bit into BIDAT, and in either case, decrements the BBCNT counter and exits the routine.

state 3 The eighth bit received from monitor 8*a* is a spare bit, a bit available for some yet to be selected data, e.g. a bit indicating that the battery pack associated with monitor 8*a* has experienced a large discharge. The communication routine shifts a "zero" bit into BIDAT, decrements the BBCNT counter and exits the routine.

state 2 The ninth bit received from monitor 8*a* is a spare bit, a bit available for some yet to be selected information. The communication routine shifts a "zero" bit into BIDAT, decrements the BBCNT counter and exits the routine.

state 1 The ninth bit received from monitor 8*a* is a parity bit. The communication routine reads the parity bit then proceeds to test the validity of the parity bit. If it is invalid, the parity error counter is incremented by a count of "one", the battery pack counter is incremented by a count of "one" to accumulate the total number of monitors in the battery pack array, the BBCNT counter is decrement by a count of "one" and the routine is exited. If the parity bit is valid, the "one" bits previously shifted into buffer BIDAT are used to increment their associated counters, the battery pack counter is incremented, the BBCNT counter is decremented, and the routine is exited.

The counters associated with the BIDAT bits are: a "large battery pack" counter for counting the total number of large size battery packs in the array, a "bad battery" counter for counting the total number of battery packs in the array requesting service; a "float" counter for counting the total number of battery packs in the array that are at float voltage; a "hot" battery pack counter for counting the number of battery packs in the array that are in an over temperature environment; a "charging" counter for counting the total number of battery packs in the array that have reported being charged by the UPS system; an "early good" counter for counting the total number of battery packs in the array that have reported that they are substantially fully charged and are known to have supplied charge to load 11.

state 0 The tenth bit received from monitor 8*a* is a stop bit, the last bit of the ten bit data word received from monitor 8*a*. The stop bit resets the BBCNT counter to 10 in preparation for restarting the scan and for transmitting the data word associated with monitor 8*b* which now resides in monitor 8*a*. The stop bit is tested, and if good, the routine is exited and subsequently a new CLK command is generated by states 0, 1 and 2. If the stop bit is invalid, the battery pack counter is decremented by one and the data received in this data word packet is invalidated.

There are two other related functions important to the communication with the monitors 8*a*, *b* and *c* that are part of other cpu 36 routines: the battery wakeup pulse routine and the routine for re-enabling the battery scan routine. The wakeup and re-enable scan routines are part of the main program loop of cpu 36. The wakeup routine moves the final BIDAT and accumulated count data to memory locations where it is available for other main cpu 36 and auxiliary cpu 37 routines including the LCD display routine. The wakeup pulse routine appends the long pulse to the end of the CLK command stream to insure that all the power supplies 66 in the monitors 8*a*, *b* and *c* are activated as discussed above.

The re-enable routine inhibits the once per second process of issuing CLK command to the monitors when the number of monitors 8*a*, *b*, and *c* is of a magnitude to cause the normal one second monitor scanning or polling cycle to exceed one second in duration. This feature was discussed above in connection with the "Reset Pulse WIDTH LIMIT TIMER" shown in FIG. 6.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A UPS system for supplying electrical power to an electrical load, the UPS system comprising:
 a plurality of battery packs electrically coupled in parallel;
 a power circuit adapted to be coupled to the load and to a main power source, the power circuit being coupled to the battery packs and configured to transfer power from the battery packs to the load;

a plurality of battery information sensors each coupled to a respective battery pack of the plurality of battery packs, each battery information sensor being configured to sense battery information, wherein the battery information includes battery pack charge and discharge current, battery pack temperature and voltage;

one or more battery pack monitors configured to receive battery information, each battery pack monitor coupled to one or more of the battery information sensors and disposed in close proximity to one or more of the battery packs, the battery pack monitors each including a programmed monitor processor configured to process the battery information; and a UPS processor coupled to the one or more battery pack monitors and configured to receive the battery information from the one or more battery pack monitors over a communication link.

2. The UPS system of claim 1 wherein the UPS processor is configured to request the battery information from the battery pack monitors.

3. The UPS system of claim 1 wherein each battery pack monitor further includes an alarm and each monitor processor is configured to activate the alarm in response to battery information processed by the programmed monitor processor, the alarm being configured to notify users that a particular battery pack coupled to the battery pack monitor requires service.

4. The UPS system of claim 3 wherein the alarm includes a light emitting diode.

5. The UPS system of claim 1 wherein each battery pack monitor further includes a power supply circuit adapted to couple the power supply circuit to at least one battery pack for generating voltages for electrical components of the battery pack monitor.

6. The UPS system of claim 1 wherein:
the communications link includes a communication command line coupled to the UPS processor and to each battery pack monitor associated with each of the battery packs among the plurality of battery packs;
the communications link includes a communication data line coupled to the UPS processor and to each battery pack monitor associated with each of the battery packs among the plurality of battery packs;
the UPS processor is configured to transmit a command to each battery pack monitor over the command line to each battery pack monitor; and
each battery pack monitor is configured to transmit the battery pack information to the UPS processor over the data line in response to receipt of a command from the UPS processor.

7. The UPS system of claim 1 wherein each battery pack monitor includes a temperature sensor and is configured to transmit a battery pack temperature indication to the UPS processor.

8. The UPS system of claim 7 wherein the battery pack temperature indication indicates that a battery pack temperature has exceeded a recommended level.

9. The UPS system of claim 1 wherein the one or more battery pack monitors are disposed within one or more respective battery packs.

10. A back-up power supply apparatus adapted for coupling to a main power source and to a load, the back-up power supply apparatus comprising:
UPS processor means for controlling the back-up power supply apparatus;
at least one local battery pack adapted to be coupled in parallel with an adjacent battery pack, each local battery pack containing a battery pack monitor, the battery pack monitor comprising;
battery information sensor means for sensing battery information about the local battery pack;
processor means for receiving and processing the battery information from the battery information sensor means;
communication means for sending and receiving the battery information to and from the UPS processor means; and
display means for providing display information based on the battery information; and
wherein, the back-up power supply apparatus includes a power circuit means, coupled to the UPS processor means, to couple the main power source to the load, and to couple the at least one local battery pack to the load.

11. The back-up power supply apparatus of claim 10 wherein at least one local battery pack is in close proximity to the battery pack monitor.

12. The back-up power supply apparatus of claim 10 wherein the communication means is for sending and receiving local battery pack information to another local battery pack, if any.

13. The back-up power supply apparatus of claim 12 wherein the display means is further configured for displaying the display information on a LCD display, wherein the LCD display is coupled to the UPS processor means.

14. The back-up power supply apparatus of claim 10 wherein the UPS processor means is for providing the battery information externally to the back-up power supply apparatus.

15. The back-up power supply apparatus of claim 10 wherein the display information includes a packet of information to be sent to the UPS processor means.

* * * * *